(12) United States Patent
Ben Mbarek et al.

(10) Patent No.: US 9,096,427 B2
(45) Date of Patent: Aug. 4, 2015

(54) METHOD FOR MAKING A SUSPENDED PART OF A MICROELECTRONIC AND/OR NANOELECTRONIC STRUCTURE IN A MONOLITHIC PART OF A SUBSTRATE

(71) Applicant: COMMISSARIAT A L'ENERGIE ATOMIQUE ET AUX ENE ALT, Paris (FR)

(72) Inventors: Sofiane Ben Mbarek, Grenoble (FR); Sophie Giroud, Saint-Egreve (FR); Frederic-Xavier Gaillard, Voiron (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/286,175

(22) Filed: May 23, 2014

(65) Prior Publication Data
US 2014/0357006 A1 Dec. 4, 2014

(30) Foreign Application Priority Data
May 28, 2013 (FR) ..................... 13 54801

(51) Int. Cl.
*H01L 21/00* (2006.01)
*B81C 1/00* (2006.01)

(52) U.S. Cl.
CPC .......... *B81C 1/00531* (2013.01); *B81C 1/0015* (2013.01); *B81C 1/00539* (2013.01); *B81B 2203/0118* (2013.01); *B81C 2201/014* (2013.01); *B81C 2201/019* (2013.01); *B81C 2201/0114* (2013.01); *B81C 2201/0115* (2013.01); *B81C 2203/036* (2013.01)

(58) Field of Classification Search
USPC ...................................... 438/50–53
See application file for complete search history.

(56) References Cited

U.S. PATENT DOCUMENTS

| 4,437,226 | A | 3/1984 | Soclof |
| 5,235,187 | A | 8/1993 | Arney et al. |
| 5,719,073 | A * | 2/1998 | Shaw et al. ..................... 438/53 |
| 7,195,946 | B2 | 3/2007 | D'Arrigo et al. |
| 2002/0017133 | A1 * | 2/2002 | Cho .......................... 73/504.02 |
| 2003/0094431 | A1 * | 5/2003 | Shing et al. .................... 216/13 |
| 2004/0067346 | A1 * | 4/2004 | Hofmann et al. .......... 428/195.1 |
| 2012/0132529 | A1 * | 5/2012 | Zekry et al. .................. 205/122 |

(Continued)

OTHER PUBLICATIONS

U.S. Appl. No. 14/395,227, filed Oct. 17, 2014, Grange, et al.

(Continued)

*Primary Examiner* — Karen Kusumakar
(74) *Attorney, Agent, or Firm* — Oblon, McClelland, Maier & Neustadt, L.L.P.

(57) ABSTRACT

Method for making at least one first suspended part of a microelectronic or nanoelectronic structure from a monolithic part of a first substrate, the method comprising the following steps:
  make a first etching with a first given depth in the monolithic substrate to define the suspended part,
  deposit a protective layer on at least the side edges of the first etching,
  make a second etching with a second depth in the first etching,
  make a physicochemical treatment of at least part of the zone located under the suspended structure so as to modify it, and
  release the suspended part by removal of the physicochemically treated part.

23 Claims, 7 Drawing Sheets

(56) References Cited

U.S. PATENT DOCUMENTS

2013/0181302 A1 7/2013 Giroud et al.
2014/0357006 A1 12/2014 Ben Mbarek et al.

OTHER PUBLICATIONS

C.J.M. Eijkel et al., "A New Technology for Micromachining of Silicon: Dopant Selective HF Anodic Etching for the Realization of Low-Doped Monocrystalline Silicon Structures", IEEE electron device letters, vol. 11, No. 12, 1990, pp. 588-589.

Noel C. MacDonald, "SCREAM Micro ElectroMechanical Systems", Microelectronic Engineering, 32, 1996, pp. 49-73.

M. Kuhl et al., Formation of Porous Silicon Using an Ammonium Fluoride Based Electrolyte for Application as a Sacrificial Layer, J. Micromech. Microeng., 8, 1998, pp. 317-322.

B. Hok et al., "Vibration Analysis of Micromechanical Elements", Sensors and Actuators, 8, 1985, pp. 235-243.

D. Molinero et al., "Properties of Oxidized Porous Silicon as Insulator Material for RF Applications", Electron Devices, 2005 Spanish Conference, Feb. 2-4, 2005, pp. 131-133.

French Preliminary Search Report issued Dec. 12, 2013, in French Application No. 13 54801 filed May 28, 2013 (with English Translation of Categories of Cited Documents).

U.S. Appl. No. 14/514,703, filed Oct. 15, 2014, Ollier, et al.

* cited by examiner

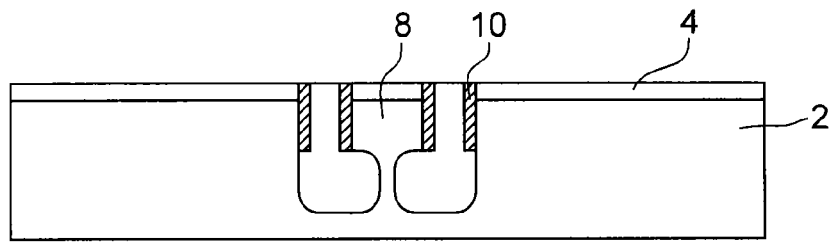
FIG.3
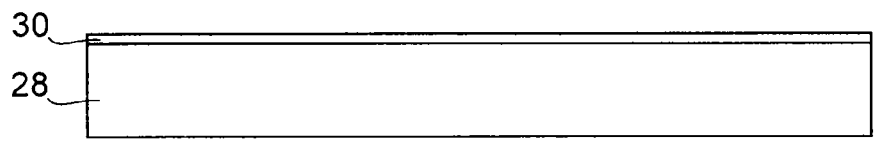
FIG.4B
FIG.4A
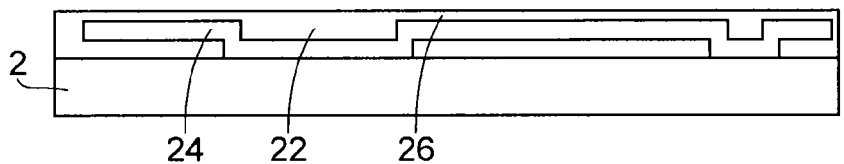
FIG.4C
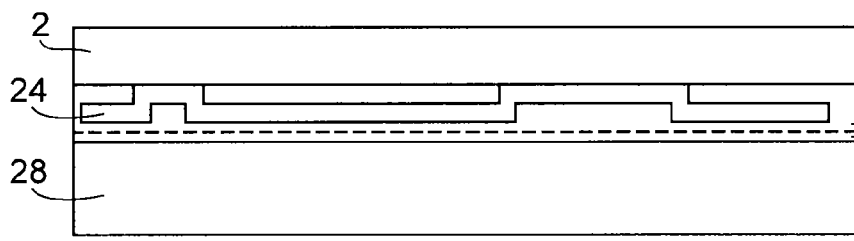
FIG.4D
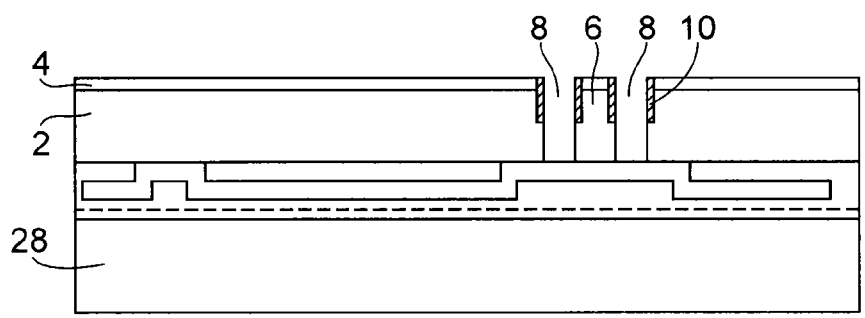
FIG.4E

METHOD FOR MAKING A SUSPENDED PART OF A MICROELECTRONIC AND/OR NANOELECTRONIC STRUCTURE IN A MONOLITHIC PART OF A SUBSTRATE

TECHNICAL FIELD AND PRIOR ART

This invention relates to a method of making a structure comprising at least one suspended part that can be implemented in the production of microelectromechanical systems (MEMS) and/or nanoelectromechanical systems (NEMS), for example for manufacturing sensors or actuators.

MEMS and NEMS sensors comprise a fixed part and at least one part suspended from the fixed part, the suspended part(s) being capable of displacing and/or deforming under the effect of an external action such as a mechanical, electrical or magnetic action.

Displacement and/or deformation of the mobile part relative to the fixed part can for example determine an acceleration in the case of an accelerometer, or a Coriolis force in the case of a gyrometer. For example, displacement of the mobile part is measured by means of a strain gauge.

Most manufacturing methods make use of non-monolithic substrates to make MEMS and/or NEMS sensors (for example SOI substrate). Use of this type of substrate results in a high cost price.

The document "*A new technology for micromachining of silicon: Dopant HF anodic etching for the realization of low-doped monocrystalline silicon structure*", IEEE electron device letters (1990), Vol. 11, No. 12 describes the production of a suspended monocrystalline structure by performing an ion implantation step of phosphorus in a p-Si substrate so as to form n-Si zones that will form the suspended structure and etch the p-Si around the n-Si zones.

This method can be used to make a monolithic structure. But it requires an ion implantation step. The thickness of n-Si zones and therefore the thickness of the suspended structure are determined by the implantation depth, but this depth is difficult to control which can lead to poor definition of the thickness of the suspended structure.

Another method called SCREAM "Single Reactive Etch and Metallization", presented in the document entitled "*SCREAM Micro ElectroMechanical Systems*", Microelectronic Engineering 32 (1996) 49-73 uses a monolithic substrate to make a MEMS component and uses a buried part of a substrate as the sacrificial layer. The method is composed of the following manufacturing steps:
  DRIE etching of the MEMS structure
  Deposition of an oxide layer,
  Anisotropic etching of the oxide
  Isotropic etching of silicon to release the MEMS
  Metallization of the structure at the flanks and on the top.

This manufacturing method allows for direct release of the suspended element, that will induce unwanted effects on the released element during subsequent steps aimed at producing an integrated assembly.

PRESENTATION OF THE INVENTION

Consequently, one purpose of this invention is to provide a method for making a suspended structure from a monolithic part of a substrate, the structure advantageously possibly being monocrystalline.

The above-mentioned purpose is achieved using a method that starts from a monolithic part of a substrate and consists of a first etching on a first depth to define the suspended structure, deposition of a protective layer on at least the side edges of the first etching, a second etching on a second depth in the first etching, a physicochemical treatment of at least part of the zone located under the suspended structure so as to modify it and release the suspended structure.

In other words, a first etching is done to define the suspended part, this suspended part being protected, a subsequent step is a second etching in the first etching to access a zone of the substrate located under the suspended part, this zone being subjected to a physicochemical treatment, and this zone then being removed to release the suspended part. Removal may take place on the zone on which the physicochemical treatment was carried out or after oxidation of the treated zone.

In this application, "monolithic part" means part of a substrate made of a single material with a single crystallographic structure with no interface.

In this application, a physicochemical treatment refers to any treatment that might locally modify a material without changing its nature. In other words, the nature of the material before and after this treatment is identical. As a corollary, oxidation is not considered as a physicochemical treatment because the material is transformed into an oxide. For example, it may be a treatment to increase the porosity of a zone of the material such as anodization, or it may be a treatment to reduce the quantity of the material in said zone such as partial isotropic etching. The purpose of this treatment is not to release the suspended part but rather to prepare for release of the suspended part. Firstly, this treatment can mechanically hold the suspended zone in position during subsequent steps in making a component. Conversely, in the case of an oxidation, the support of the structure to be released would be completely transformed into oxide. This complete transformation would create high mechanical stresses that would affect the morphology of the target structure. With the invention, this problem can be overcome through the use of an intermediate physicochemical treatment. Furthermore, the treatment facilitates subsequent release of said suspended zone.

In one example embodiment, the physicochemical treatment is an anodization step.

Very advantageously, the monolithic part is monocrystalline and has very good electrical and mechanical properties for a MEMS and/or NEMS sensor or actuator.

Preferably, an oxidation step is performed before the suspended part is released. Very advantageously, the oxidation step comprises a first oxidation sub-step at a first temperature and a second oxidation sub-step at a second temperature, the second temperature being higher than the first temperature, the first step at the lower temperature can reduce risks of thermal shock that could deform the treated layer and retard its complete oxidation.

The manufacturing method can also be used to make functional structures directly integrating MEMS and/or NEMS comprising at least one suspended part made by the method according to the invention and at least one other suspended part. Very advantageously, the two suspended parts are released simultaneously.

The subject-matter of this invention is then a method for making at least one first suspended part of a microelectronic or nanoelectronic structure from a monolithic part of a first substrate comprising a front face and a back face, said method comprising the following steps:

a) make a first etching with a first given depth in the front face so as to delimit the first suspended part by trenches, the trenches being delimited by side edges and a bottom, b) deposit a protective material on at least the side edges of the trenches forming the flanks of the first suspended part, said protective material being capable of protecting said side edges against a subsequent physicochemical treatment, c) make a second etching at least in the bottom of the trenches so as to obtain trenches with a second depth greater than the first depth, the side edges then comprising a part covered by the protective material and a part not covered by the protective material, d) make a physicochemical treatment of the first substrate in part of the side edges not covered by the protective material so as to at least partly modify a zone of the substrate placed opposite the front face relative to the first suspended part, called the treated zone, e) release the first suspended part by removal of at least the zone treated in step d).

The method according to the invention is done in a monolithic part of the substrate; in other words, this substrate may be monolithic or it may be composed of a mainly monolithic part associated with other layers on the back face that do not participate in production of the first suspended part, the different etchings of the trenches being made in the monolithic part.

In one example, the physicochemical treatment is an electrochemical treatment that may be an anodization.

In another example, the physicochemical treatment is a partial isotropic etching.

The first substrate may advantageously be a monocrystalline semiconducting material.

Very advantageously, the production method may comprise a step d1) to oxidize at least the treated zone between step d) and step e), and step e) is a step to remove the oxidized zone. Step d1) preferably comprises a first oxidation sub-step at a first temperature and a second oxidation sub-step at a second temperature, the second temperature being higher than the first temperature.

The first temperature may for example be between 400° C. and 500° C. and the second temperature may for example be higher than 500° C.

In one example embodiment, in step a), before etching, another layer of protective material may be deposited on the front face of the first substrate, said protective material being capable of protecting the front face against the physicochemical treatment in step d).

For example, the material from which the protective layer(s) is (are) made is a dielectric material or a metallic material.

The thickness of the protective layer(s) may be between a few tens of nanometers and a few hundred nanometers.

In another example embodiment, a first resin layer is deposited on the front face of the first substrate in step a) before the first etching, said first resin layer being removed after the first etching and before step b), and a second resin layer is deposited on the layer of protective material during step c) before the second etching, said second resin layer being removed after the second etching.

Another subject-matter of this invention is a method of making a microelectromechanical and/or nanoelectromechanical structure comprising at least a first and a second suspended part, in an assembly comprising a first substrate of which at least the front face is at least partially made of a semiconducting material, a second substrate and zones made of dielectric material and/or zones made of conducting or semiconducting material being located at the interface between the first substrate and the second substrate, the first and the second suspended part being made in at least one of said faces of the first substrate, at least the first suspended part being obtained using the method according to this invention.

The second substrate may be transferred onto the first substrate before the second suspended part is made by etching, said second part being made on the front face or the back face of the first substrate, said first and second part being released after transfer of the second substrate onto the first substrate.

The first suspended part is indifferently made before or after transfer of the second substrate.

The manufacturing method may comprise a step to etch the first substrate at its back face to reach the treated and/or oxidized zone.

The first suspended part and the second suspended part may be released simultaneously and made starting from the front face. For example, the first suspended part and the second suspended part may be released by removal of oxide.

The second etching in step c) may reach the interface between the first and the second substrates.

In one example embodiment, the protective material(s) is (are) removed at the end of the step d1) and at least the open end of the trenches is closed off before the step for production of the second suspended part when the first and second suspended parts are formed on the front face. For example, the open end of the trenches is close off by deposition of an oxide, advantageously a TEOS oxide. As a variant, the open end of the trenches is closed off by means of a dry film.

In another example embodiment, the second suspended part is made by etching the back face of the first substrate. An oxide layer can then be formed on the front face of the first substrate before it is assembled with the second substrate, forming a stop layer for etching the second suspended part. The first suspended part may be released by removal of the treated or oxidized zone and the second suspended part may be released by removal of said oxide layer, said release operations being done simultaneously.

BRIEF DESCRIPTION OF THE DRAWINGS

This invention will be better understood after reading the following description and the appended drawings in which:

FIG. 3 is a diagrammatic view of a variant physicochemical treatment, FIGS. 4A to 4J are diagrammatic views of different steps in performing an example of a method for making a functional MEMS and/or NEMS structure.

The same references will be used to denote the same elements that have approximately the same function in the different example embodiments and the different variants.

DETAILED DESCRIPTION OF PARTICULAR EMBODIMENTS

Figure 1A:
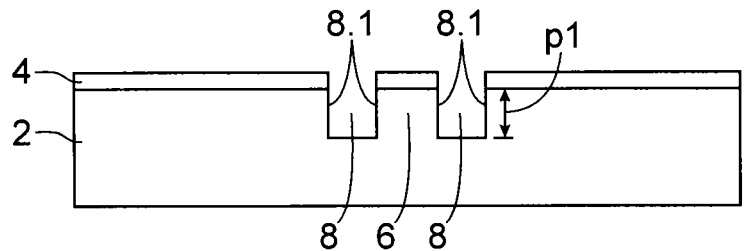
FIGS. 1A to 1F are diagrammatic views of different steps in making a suspended structure using a method according to the invention.

FIGS. 1A to 1F diagrammatically show the different steps of a suspended part according to an example of the manufacturing method according to the invention.

In this application, "suspended part" of a MEMS and/or NEMS structure refers to a part that can move and/or deform under the effect of an external action (mechanical, electrical, magnetic, etc.), and the expressions "suspended part", "suspended element", "suspended zone" will be used indifferently in this application.

In the following description and for reasons of simplicity, a fully monolithic substrate will be considered and particularly the example of silicon as the semiconducting material will be used. Note that any other semiconducting material such as Ge, SiGe, SiC, etc. can be used without going outside the scope of this invention.

The method according to the invention advantageously uses a first substrate 2 made of monocrystalline silicon.

The steps in the method as shown in FIGS. 1A to 1F can be used to make a suspended part, but it will be understood that several suspended parts could be made simultaneously.

In a first step, a first barrier or protective layer 4 is formed on at least parts of the substrate 2 exposed to the physicochemical treatment that will be performed later. The material for the first barrier layer 4 is chosen so as to form a barrier to the physicochemical treatment that will be performed later. This barrier layer may be made of a dielectric material such as an oxide or a nitride or a metallic material. Depending on the material chosen, the barrier layer may be deposited by different techniques such as Chemical Vapor Deposition (CVD), Atomic Layer Deposition (ALD), Physical Vapor Deposition (PVD). The first barrier layer 4 may for example be made of $Si_3N_4$ in the case of a physicochemical anodization treatment by hydrofluoric acid. The first barrier layer 4 may for example be between a few tens of nanometers and a few hundred nanometers thick, for example 200 nm thick.

In a subsequent step, the contours of the suspended part 6 are defined in the substrate 2 and the first barrier layer 4 by making a lithography and then etching them to a first depth p1, etching forming trenches 8. For example, a Reactive Ion Etching (RIE) may be used. The depth p1 may be between about a hundred nanometers and several tens of micrometers.

In a next step, a second barrier layer 10 is formed so as to cover at least the side edges 8.1 of the trenches 8 so as to protect the side edges, particularly the suspended part 6, from the second etching. The material from which the second barrier layer 10 is made is chosen so as to form a barrier to the physicochemical treatment that will be applied later. The material used for the second barrier layer may be chosen from among dielectric materials such as oxides, nitrides or metallic materials.

Preferably, the second barrier layer 10 covers the first barrier layer 4, thus providing sufficient protective thickness of the substrate during a second etching of the trenches.

Preferably, the material of the second barrier layer 10 is exactly the same as the material of the first barrier layer 4, but a different material could be envisaged.

For example, the second barrier layer 10 may be between a few tens of nanometers and a few hundred nanometers thick, for example 100 nm. In the example shown, the second barrier layer 10 also covers the bottom of the trenches 8. The second barrier layer thus deposited on the sides of the trenches 8.1 will define the thickness of the suspended part 6 that is shown in dashed lines. Depending on the material chosen, the second barrier layer may be deposited by different techniques such as Chemical Vapor Deposition (CVD), Atomic Layer Deposition (ALD), Physical Vapor Deposition (PVD).

Figure 1B:
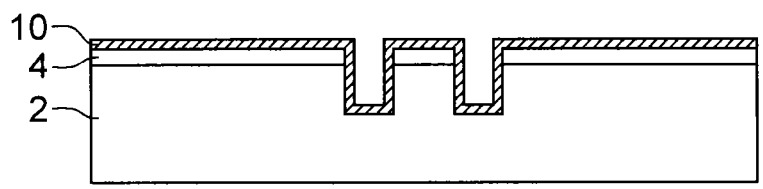

The element thus obtained is shown in FIG. 1B.

In a subsequent step, a second etching takes place in the trenches 8 so as to increase the depth of the trenches to a second given depth p2. Due to the presence of the second barrier layer 10, the side edges of the trenches 8 over the depth p1 are not etched by this second etching. For example, this second etching may be an RIE etching. The depth p2 may be between about a hundred nm and several tens of μm. During this second etching, at least part of the second barrier layer 10 located on the front face of the substrate 2 is consumed, but due to the presence of the first barrier layer 4, any risk of etching the front face of the substrate 2 is avoided. In the example shown, the entire second barrier layer 10 was consumed on the front face.

Figure 1C:
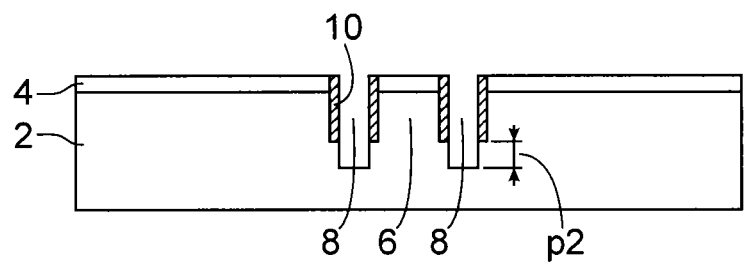

The element thus obtained is shown in FIG. 1C.

In a next step, a physicochemical treatment is applied to the element in FIG. 1C, and more particularly to the zone of substrate 2 located under the suspended part 6; this zone is denoted 12. The physicochemical treatment locally modifies the substrate 2, at least part of the zone 12 at the portion of the side edges of the trenches not covered by the second barrier layer 10.

For example, this physicochemical treatment is an electrochemical treatment acting on the sidewalls of the trenches 8. For example, this treatment may be an anodization, for example in a solution based on 30% hydrofluoric acid with application of a current of 100 mA. If anodization is used, the zone 12 has increased porosity.

Figure 1D:
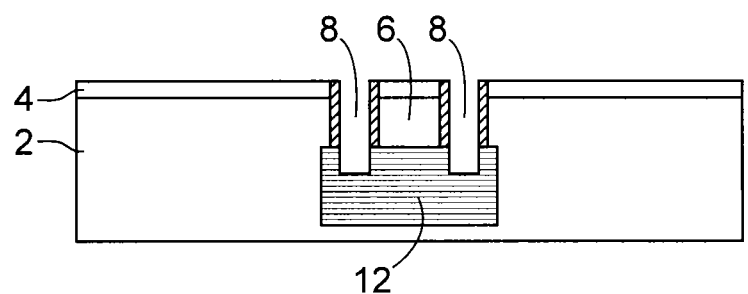

The element thus obtained is shown in FIG. 1D.

In a next step, the suspended part 6 is released by removal of the treated substrate zone located under the suspended part 6. This release may be obtained by etching the treated zone directly, for example by dry or wet etching, releasing the suspended part 6.

Advantageously, an oxidation step, for example a thermal oxidation, takes place before this release step.

This additional oxidation step prepares release of the suspended part and holds the suspended part mechanically until it is released.

Preferably, the oxidation step comprises two sub-steps, a first sub-step at low temperature and a second sub-step at high temperature.

The first sub-step corresponds to a pre-oxidation, and takes place for example at a temperature of between 400° C. and 500° C., which stabilizes the initial structure of the treated zone 12 against irreversible transformations during the high temperature heat treatment in the second sub-step.

If this first sub-step is not performed, it is possible that a direct oxidation at high temperatures, i.e. higher than 500° C., will apply a thermal shock to the porous silicon causing deformation of the morphology of the porous layer that can hinder complete oxidation.

The second sub-step is an oxidation at a higher temperature, i.e. higher than 500° C.

Figure 1E:
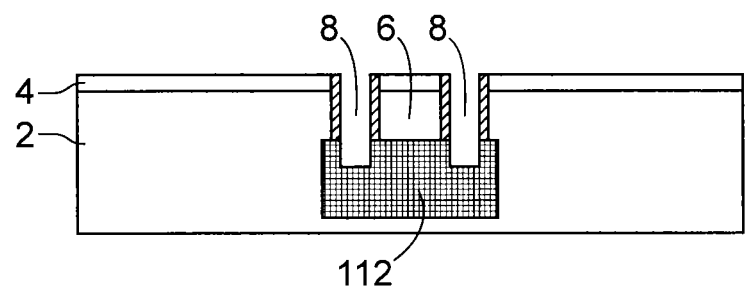

The element thus obtained is shown in FIG. 1E. The oxidized zone is denoted 112.

The oxidized porous silicon is then eliminated, for example by wet etching with hydrofluoric acid, releasing the suspended part 6.

Figure 1F:
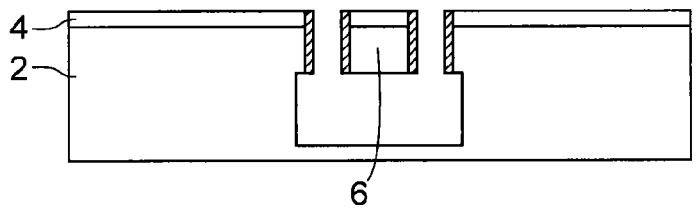

The element thus obtained is shown in FIG. 1F.

As a variant, the local physicochemical treatment is a partial isotropic etching. This etching may be a dry or wet etching. The element thus obtained is shown in FIG. 3. In this case, the zone 12 is partially etched, the quantity of the material to be removed for final release is then reduced. The suspended part is held in place mechanically until it is released. The material remaining under the suspended part may advantageously be oxidized, for example by thermal oxidation. In this case, oxidation in a single step rather than in two sub-steps is sufficient.

As can be seen diagrammatically in FIG. 3, isotropic etching tends to cause etching of the lower part of the suspended part. In this case, during the first etching, trenches are made with a depth greater than the required depth for the suspended part so as to compensate for the loss of material due to partial isotropic etching.

FIGS. 2A to 2D diagrammatically show a variant of steps 1A to 1C.

During a first step, a resin layer 14 is deposited on the substrate 2 and lithography is applied defining the contours of the suspended part 6 in the first resin layer 14. The resin used may be a resin used conventionally in photolithography methods in microelectronics and nanoelectronics.

In a next step, a first etching takes place forming trenches 8 delimiting the suspended part 6.

Figure 2A:
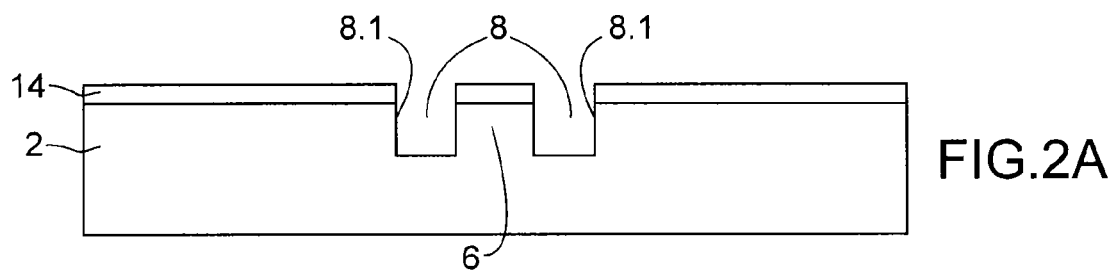
FIGS. 2A to 2D are diagrammatic views of a variant embodiment of the method shown in FIGS. 1A to 1F.

The element thus obtained is shown in FIG. 2A.

In a next step, the resin layer is removed and a barrier layer 16 is deposited on the top surface of the substrate and on the side edges 8.1 of the trenches 8. In the example shown, the barrier layer 16 also covers the bottom of the trenches 8. The barrier layer has the same characteristics as the barrier layers used in the method in FIGS. 1A to 1F, and for example it may be made of $Si_3N_4$.

Figure 2B:
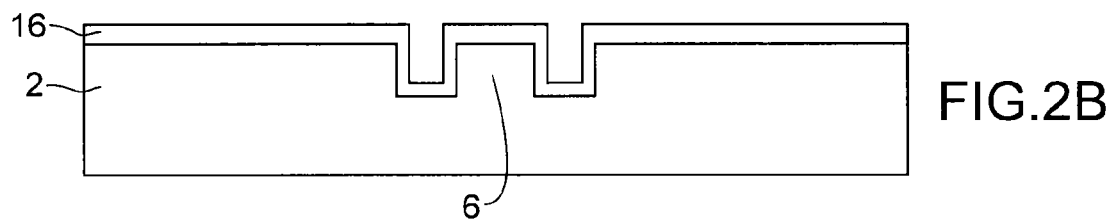

The element thus obtained is shown in FIG. 2B.

In a next step, another resin layer 18 is deposited on the barrier layer 16.

In a next step, the resin layer is lithographed so as to clear the bottom of the trenches 8 and therefore the barrier layer 16 covering the bottom of the trenches.

Figure 2C:
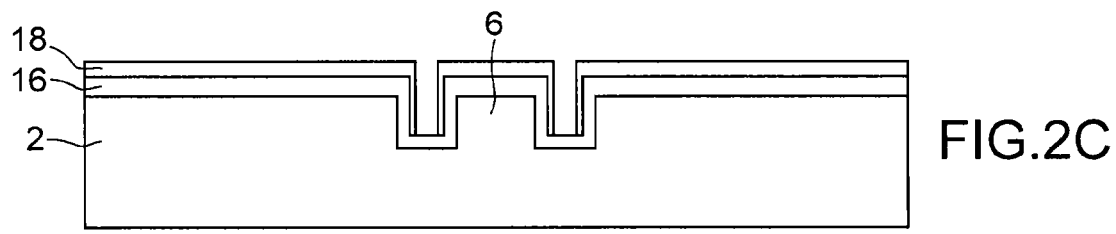

The element thus obtained is shown in FIG. 2C.

In a next step, a second etching of the substrate is made starting from the bottom of the trenches after firstly etching the portions of the barrier layer covering the bottom of the trenches. For example, this etching may be done using an RIE method. Due to the presence of the second resin layer 18 on the front face of the substrate 2, the barrier layer 16 is protected and the risk of etching the front face of the substrate 2 is avoided.

The resin layer 18 is removed in a next step.

Figure 2D:
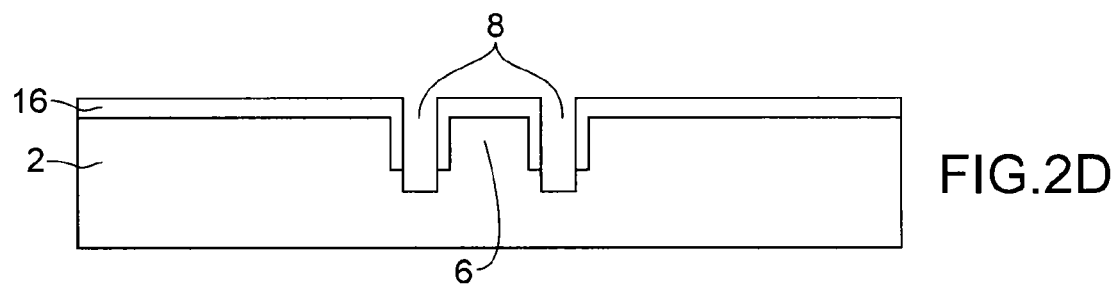

The element thus obtained is shown in FIG. 2D.

The next steps are similar to steps 1D, 1E and 1F and will not be described again.

This variant has the advantage that it avoids a double deposition of the barrier layer, which limits the stresses that may be induced by this deposit and protects the side edges 8.1 when the bottom of the trenches is being etched.

The method according to the invention making use of a physicochemical treatment step after a two-step etching, can be used to make a suspended part for which the material is the same as the fixed part or the support. Furthermore, by choosing a monocrystalline substrate, it is easy to obtain a suspended part made of a monocrystalline material of which the mechanical and electrical properties are particularly interesting for a MEMS and/or NEMS actuator or sensor.

Furthermore, this method avoids the need to use one or more epitaxial deposition steps and one or more ion implantation steps.

Furthermore, the oxidation step before release enables simultaneous release of the different suspended parts using the same method, in the case of a complete integration in which at least one other suspended part is made.

The oxidation step in two sub-steps guarantees the morphology of the suspended part.

Furthermore and advantageously, the method according to the invention does not require an SOI substrate which reduces the manufacturing cost.

Finally, the method according to the invention makes three-dimensional integration possible.

FIGS. 4A to 4I show an example embodiment of a functional MEMS and/or NEMS structure including several suspended parts. The method that will be described can be used to make a structure comprising two suspended elements, the suspended part 6 and for example a suspended mass. Therefore the method can be used to make a structure including at least one MEMS and/or at least one NEMS on a single substrate.

Firstly, for example, a dielectric oxide layer 22 is formed on the back face of a first substrate 2 made of Si, SiGe, Ge, SiC.

In a next step, a layer made for example of polycrystalline silicon 24 is formed on the oxide layer such that the layer 24 is in partial contact with the first substrate 2. To achieve this, the oxide layer 22 is structured so as to reach the first substrate 2 in different zones, and the layer of polycrystalline silicon 24 is then deposited.

Another oxide layer 26 may be deposited on the structured layer 24 forming a planarizing layer.

Several interconnections may be stacked.

The stack shown in FIG. 4A is obtained.

A second substrate 28 is then made as shown in FIG. 4B. It is chosen from a family of semiconductors such as Si, SiGe, Ge, SiC and it may be a material different from the material used for the first substrate. An oxide layer 30 may be deposited at least on the front face of the second substrate 28.

The two stacks are then bonded by oxide layers 26 and 30. An oxide-oxide bonding is then made. In the case in which the first substrate does not comprise a planarizing layer 26, bonding is bonding on a silicon-oxide cavity and more generally bonding on a semiconductor-oxide cavity.

Oxide-oxide or semiconductor-oxide bonding techniques are well known to those skilled in the art and will not be described.

The thicknesses of the different layers made may vary between a few tens of a nanometers and several micrometers.

In a next step, the element thus obtained can be thinned by the front face of the first substrate 2 for example to reach a thickness of between about 5 µm and about 100 µm.

The element thus obtained is shown in FIG. 4C. The first substrate 2 is located in the top part and the second substrate is in the bottom part.

In a next step, a first barrier layer 4 is formed on the front face of the element in FIG. 4C, for example a nitride layer such as $Si_3N_4$, for example with a thickness of 200 nm. The barrier layer may for example be made by a Low-Pressure Chemical Vapor Deposition (LPCVD).

In a next step, the suspended part is defined for example by lithography on the first barrier layer 4. For example, a suspended part 6 with a width of between 0.2 µm and 5 µm and a length of between 1 µm and 20 µm is obtained.

In a next step, the barrier layer 10 is etched stopping on the first substrate 2.

In a next step, a second barrier layer 10 is deposited at least on the side edges of the trenches, for example with a thickness of 50 nm. The second barrier layer 10 may for example also be made of nitride such as $Si_3N_4$.

In a next step, a second etching of the bottom of the trenches 8 is made stopping in the interface between the first and second substrates.

The element thus obtained is shown in FIG. 4D.

In a next step, a physicochemical treatment is applied at least on the zone of the first substrate 2 located under the suspended part 6. For example, this may be an electrochemical treatment, for example an anodization. For example, the anodization is made with a hydrofluoric acid solution.

The element thus obtained is shown in FIG. 4E.

In a next step, an oxidization of the previously treated zone 12 is advantageously performed, for example a thermal oxidation. Preferably, the oxidation takes place in two sub-steps as described with reference to FIG. 1E. This oxidation step holds the suspended part until all suspended elements are finally released, which simplifies the different subsequent steps of the method. Furthermore, the suspended part and the suspended mass that will be made underneath it, can be released simultaneously by a single oxide etching step. Therefore the release step is simplified. The oxidized zone is denoted 112.

Figure 4F:
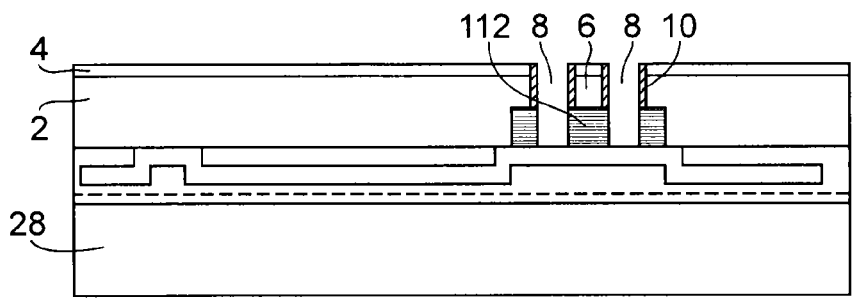

The element thus obtained is shown in FIG. 4F.

Advantageously but not necessarily, the two barrier layers are removed in a next step, for example by chemical etching based on $H_3PO_4$ in the case of $Si_3N_4$, barrier layers.

Figure 4G:
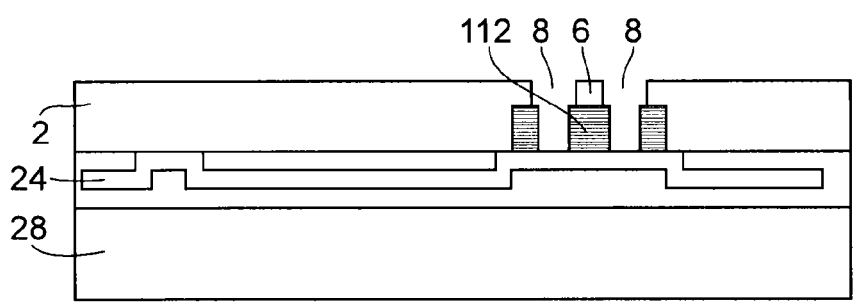

The element thus obtained is shown in FIG. 4G.

In a next step, a layer 32 is formed that will close off the trenches in order to protect the suspended part 6. For example, the layer 32 is an oxide layer, made at least at the trenches 8 on each side of the suspended part 6. For example, this oxide layer 32 is formed by deposition. The oxide layer 32 is advantageously deposited by plasma assisted chemical vapor deposition from tetraethoxysilane (TEOS) in an oxygen or oxygen-argon plasma.

Figure 4H:
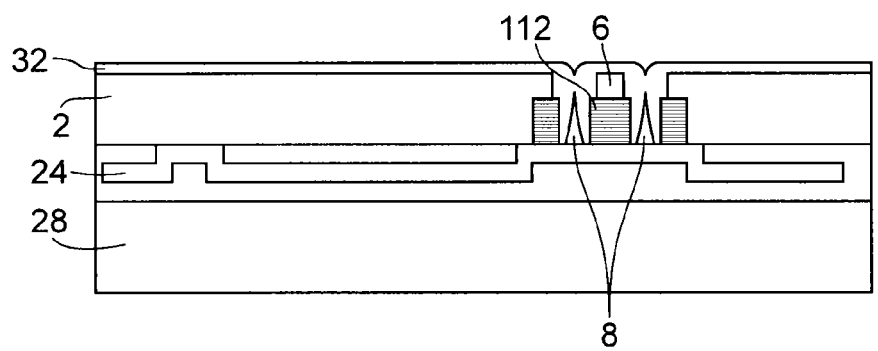

In the example shown, the layer 32 also covers the front face of the element, but as explained above, this is not limitative. The element thus obtained is shown in FIG. 4H.

As a variant, instead of forming an oxide layer 32 to close off the trenches, a photosensitive dry film is deposited using a film lamination technique. If necessary, this film can be partly removed through a standard photolithography step, so that it is only left at least on the trenches to be closed off.

In a next step, a second suspended part 34 is made, for example a suspended mass 34, by etching the first substrate 2 through the oxide layer 32. In the example shown, during this etching step, the side edges of the trenches 8 are also etched. It would be possible to apply etching so as to only etch the first substrate 2 to make the suspended mass without etching the side edges of the trenches 8.

Figure 4I:
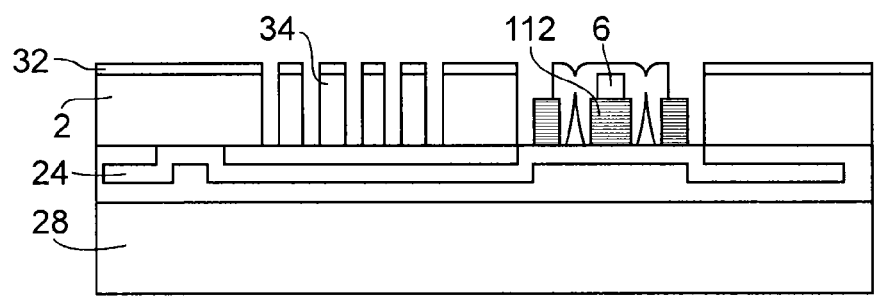

The element thus obtained is shown in FIG. 4I.

In a next step, the suspended part 34 and the suspended part 6 are released simultaneously by etching the oxide located under the suspended mass 32 and the oxide supporting the suspended part 6, this oxide having been formed after the physicochemical treatment step. For example, this etching is a time etching by hydrofluoric acid.

Figure 4J:
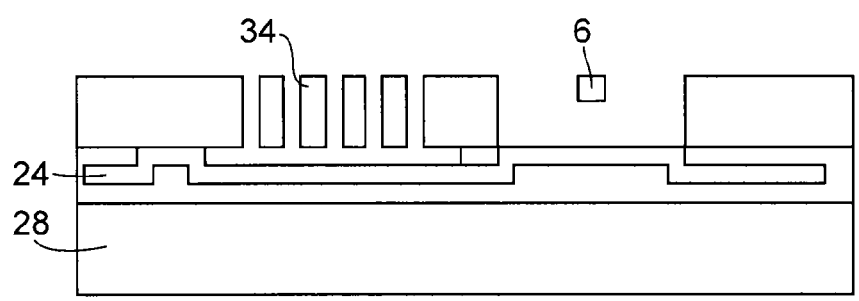

The element thus obtained is shown in FIG. 4J.

This method can be used to make an assembly of several suspended parts simultaneously, for example an integrated MEMS structure and NEMS structure.

We will now describe a method of making an MEMS and/or NEMS assembly according to another example embodiment. The steps in this example are shown in FIGS. 5A to 5M.

Firstly, a first element is made comprising the suspended part 6. The steps 5A to 5D are similar to steps 1A to 1D and will not be described again. This method is different from the method shown in FIGS. 4A to 4J particularly in that the first suspended part 6 is made at least partly in the first substrate 2 before assembly of the first and second substrates.

Figure 5A:
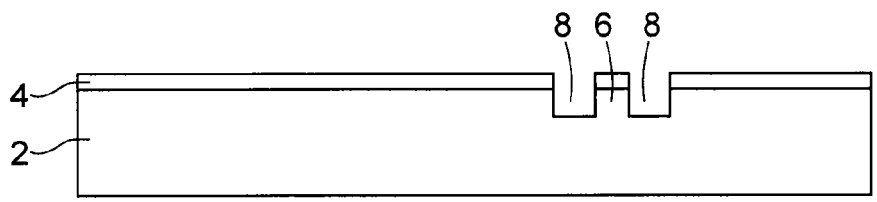
FIGS. 5A to 5M are diagrammatic views of different steps in a method for making a functional MEMS and/or NEMS structure according to another example embodiment.
Figure 5B:
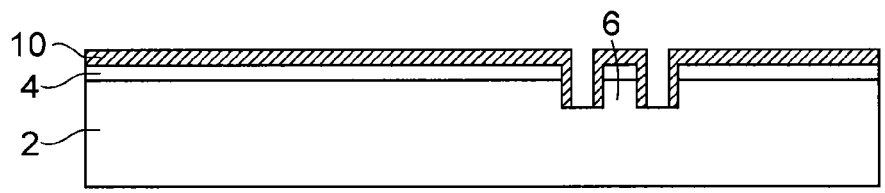
Figure 5C:
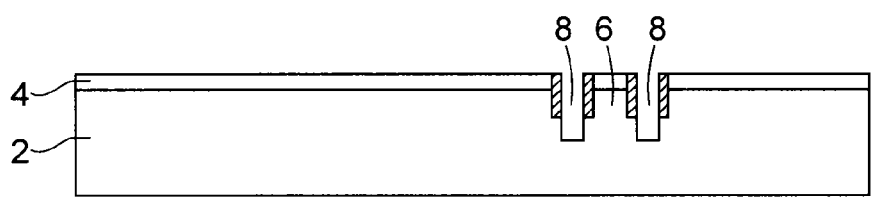
Figure 5D:
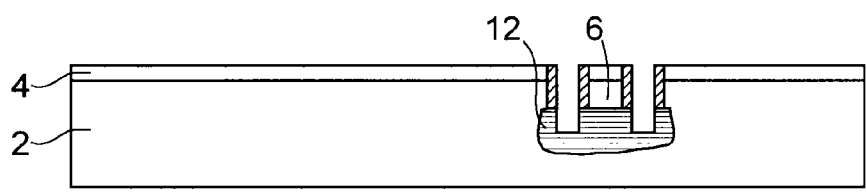
Figure 5E:
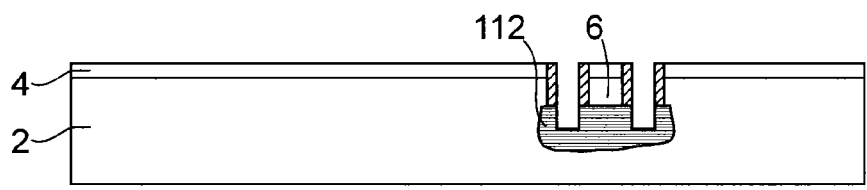

Advantageously, the method comprises an oxidation phase of the treated zone 12, advantageously following the two sub-steps described above. The oxidized zone 112 located under the suspended part 6 is kept to form a mechanical support until complete release of all suspended elements. The element obtained is shown in FIG. 5E.

Figure 5F:
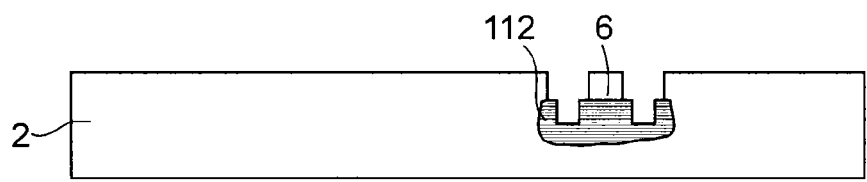

In a next step, the first and second barrier layers 4, 10 are advantageously removed. This step is not necessary. The element thus obtained is shown in FIG. 5F.

In a next step, an oxide layer 36 may be deposited on the front face of the first substrate 2 to act as a bonding layer with the second substrate and the stop layer for a future etching.

The oxide layer 36 may advantageously be structured to keep oxide portions only in bonding zones with the second substrate and vertically in line with the suspended elements that will be made later.

Figure 5G:
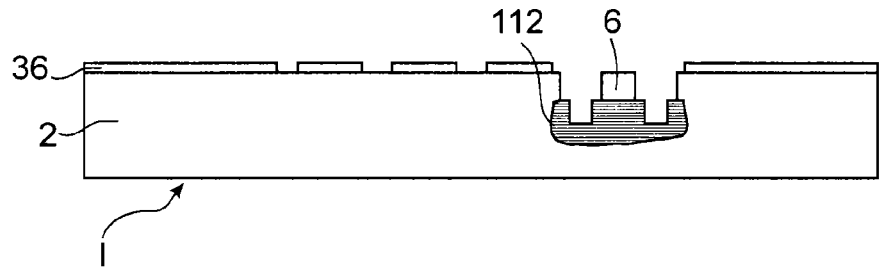

The element thus obtained is shown in FIG. 5G and is denoted I.

Secondly, a layer made of a dielectric material 42, for example oxide obtained by thermal oxidation, is deposited on the front face of a second substrate 40.

In a next step, a conducting layer 44 is formed, for example made of Si that can act as an electrode for example. The layer 42 is preferably structured such that the conducting layer 44 is in direct contact with the second substrate 40. The conducting layer 44 may be etched.

Figure 5H:
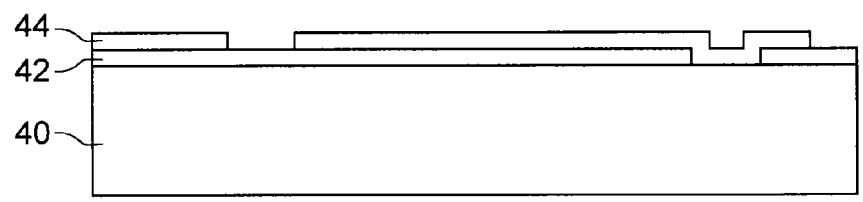

The element thus obtained is shown in FIG. 5H.

A dielectric layer 46, preferably an oxide, is formed on the conducting layer 44. The dielectric layer 46 may for example be formed by oxidation or by deposition of an oxide layer, for example by PECVD. This layer may advantageously be etched vertically in line with the first and second suspended parts in order to release all or some of the future suspended zones.

Figure 5I:
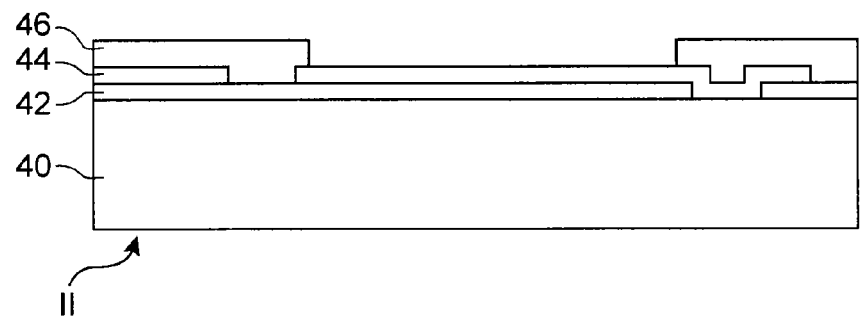

The element thus obtained is shown in FIG. 5I and is denoted II.

It could be envisaged to make an alternating stack of dielectric layers and conducting layers, the conducting layers being in contact with each other and/or with the second substrate so as to create different levels of electrical interconnections.

In a next step, the two elements I and II are assembled by bringing their front face into contact and for example by direct bonding.

In the case in which each of the two elements comprises an oxide layer on its front face, the assembly is obtained by oxide-to-oxide bonding. In the case in which only one of these elements comprises an oxide layer on the front face and the other element comprises a silicon front face, the assembly is obtained by oxide-to-silicon bonding. In this case, it will be understood that if the front face is made of a material other than silicon, for example Ge, the assembly will be an oxide-to-Ge assembly.

Bonding is done partly on cavities regardless of the configuration, this may be an oxide-to-oxide, oxide-to-semiconductor bonding such as oxide-to-Si bonding.

Figure 5J:
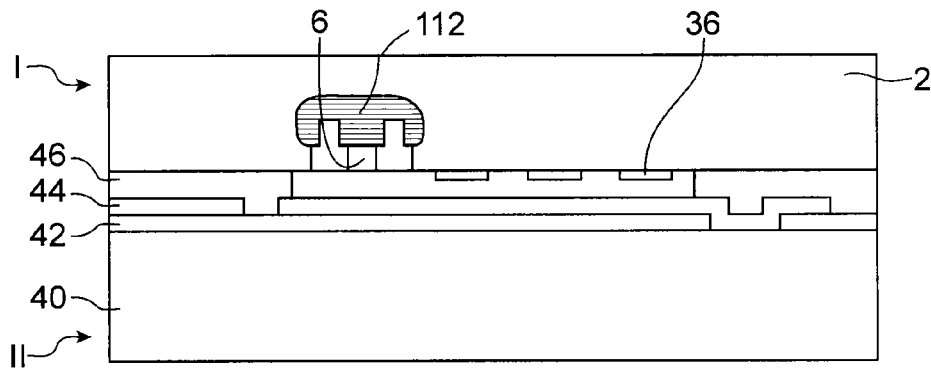

The element thus obtained is shown in FIG. 5J.

In a next step, the first substrate 2 may be thinned starting from its back face, for example by grinding and planarization techniques to define the thickness of the second suspended element. The first substrate may be thinned to reach a thickness of between about 5 μm and about 100 μm.

It would be possible to make connections between the different elements of the future component, namely the first substrate, the second substrate and the conducting layer(s) deposited on the second substrate. In the example embodiment shown, a connection using a via 48 is made between the first substrate and the deposited conducting layer(s) and the second substrate. The via 48 is made using techniques known to those skilled in the art. It will be understood that several vias could be made. Other connection techniques could be used.

Figure 5K:
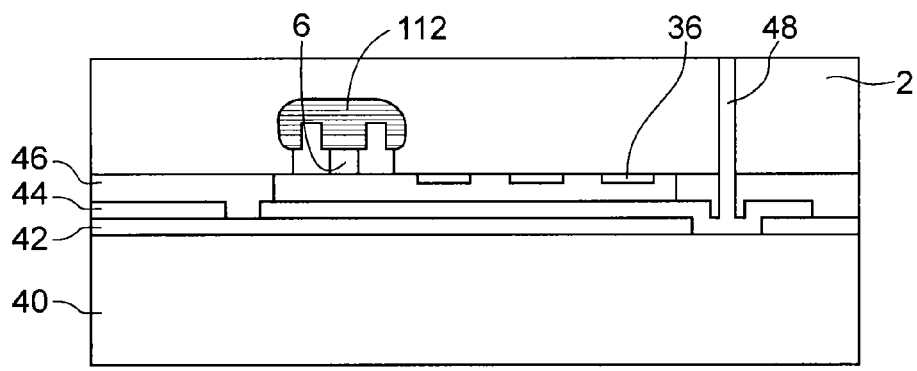

The element thus obtained is shown in FIG. 5K.

In a next step, another suspended element 50 will be made, for example a suspended mass of an MEMS or a NEMS. This is done by performing lithography and etching steps; preferably, it will be a Deep Reactive Ion Etching DRIE. Note that in the example shown, DRIE etching stops in the oxide layer 36 advantageously prepared on the substrate 2. The presence of the oxide layer prevents DRIE etching which is difficult to control, from opening up directly in a cavity. Otherwise, there would be a risk that the suspended structure might break. Furthermore, the oxide layer 36 stops DRIE etching and avoids etching or modifying the layer 44 which for example may be made of polysilicon and can be etched by DRIE.

Figure 5L:
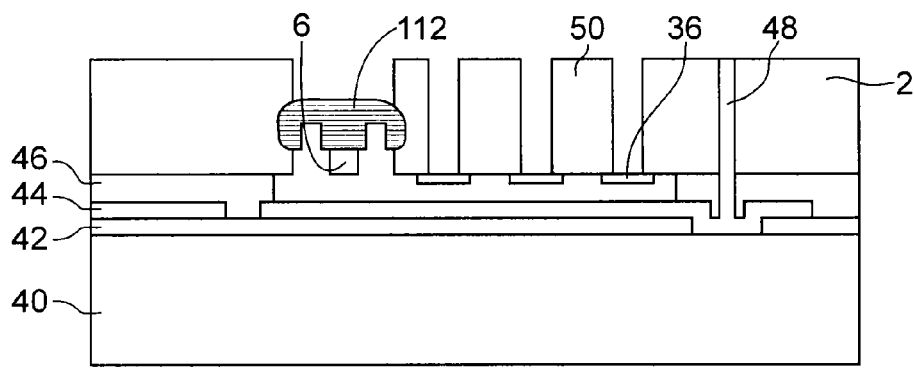

The element thus obtained is shown in FIG. 5L.

In a next step, the suspended zones 6, 50 are completely released by eliminating the oxide holding the suspended part and the oxide binding the suspended mass to the substrate. This release may be obtained for example by hydrofluoric acid.

Figure 5M:
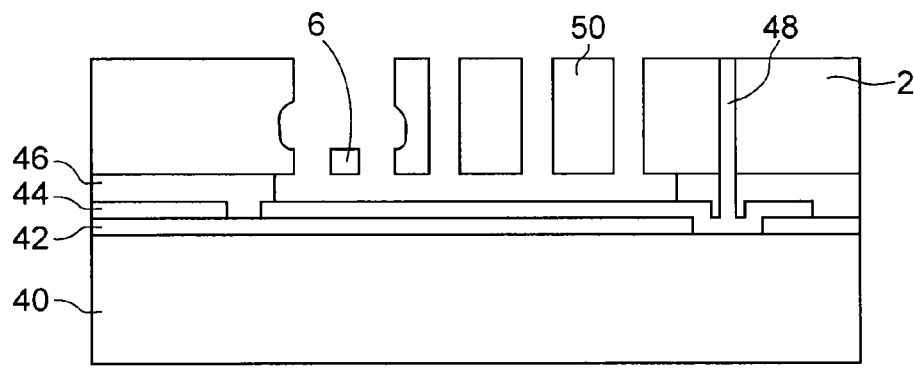

The element thus obtained is shown in FIG. 5M.

It will be understood that partial isotropic etching may be applied to the methods shown in FIGS. 2A to 2D, 4A to 4J and 5A to 5M. Similarly, steps 2A to 2D making use of the first and second resin layers may be used in the methods in FIGS. 4A to 4J and 5A to 5M.

The method according to the invention is particularly useful for making monolithic monocrystalline suspended elements with the substrate and relatively easily making structures including MEMSs and/or NEMSs.

The invention claimed is:

1. A method for making at least one first suspended part of a microelectronic or nanoelectronic structure from a monolithic part of a first substrate comprising a front face and a back face, said method comprising the following steps:
   a) make a first etching with a first given depth in the front face so as to delimit the first suspended part by trenches, the trenches being delimited by side edges and a bottom,
   b) deposit a protective material on at least the side edges of the trenches forming flanks of the first suspended part, said protective material being capable of protecting said side edges against a subsequent physicochemical treatment,
   c) make a second etching at least in the bottom of the trenches so as to obtain trenches with a second depth greater than the first depth, the side edges then comprising a part covered by the protective material and a part not covered by the protective material,
   d) make a physicochemical treatment of the first substrate in the part of the side edges not covered by the protective material so as to at least partly modify a zone of the substrate placed opposite the front face relative to the first suspended part, called a treated zone,
   e) release the first suspended part by removal of at least the zone treated in step d).

2. The method according to claim 1, in which the physicochemical treatment is an electrochemical treatment.

3. The method according to claim 2, in which the treatment is an anodization.

4. The method according to claim 1, in which the physicochemical treatment is a partial isotropic etching.

5. The method according to claim 1, in which the first substrate is a monocrystalline semiconducting material.

6. The method according to claim 1, comprising, a step d1) to oxidize at least the treated zone between step d) and step e), and step e) is a step to remove the oxidized zone.

7. The method according to claim 6, in which step d1) comprises a first oxidation sub-step at a first temperature and a second oxidation sub-step at a second temperature, the second temperature being higher than the first temperature.

8. The method according to claim 7, in which the first temperature is between 400° C. and 500° C. and the second temperature is higher than 500° C.

9. The method according to claim 1, in which in step a), before etching, another layer of protective material, is deposited on the front face of the first substrate, said protective material being capable of protecting the front face against the physicochemical treatment in step d).

10. The method according to claim 1, in which the protective material is a dielectric material or a metallic material.

11. The method according to claim 1, in which a thickness of the protective material is between a few tens of nanometers and a few hundred nanometers.

12. The method according to claim 1, in which in step a) before the first etching, a first resin layer is deposited on the front face of the first substrate, said first resin layer being removed after the first etching and before step b), and a second resin layer is deposited on the protective material during step c), before the second etching, said second resin layer being removed after the second etching.

13. A method of making a microelectromechanical and/or nanoelectromechanical structure comprising at least a first and a second suspended part, in an assembly comprising a first substrate of which at least a front face is at least partially made of a semiconducting material, a second substrate and zones made of dielectric material and/or zones made of conducting or semiconducting material being located at an interface between the first substrate and the second substrate, the first and the second suspended part being made in at least one face of the first substrate, at least the first suspended part being obtained using a method comprising the following steps:
   a) make a first etching with a first given depth in the front face of the first substrate so as to delimit the first suspended part by trenches, the trenches being delimited by side edges and a bottom,
   b) deposit a protective material on at least the side edges of the trenches forming flanks of the first suspended part, said protective material being capable of protecting said side edges against a subsequent physicochemical treatment,
   c) make a second etching at least in the bottom of the trenches so as to obtain trenches with a second depth greater than the first depth, the side edges then comprising a part covered by the protective material and a part not covered by the protective material,
   d) make a physicochemical treatment of the first substrate in the part of the side edges not covered by the protective material so as to at least partly modify a zone of the substrate placed opposite the front face relative to the first suspended part, called a treated zone,
   e) release the first suspended part by removal of at least the zone treated in step d).

14. The method according to claim 13, in which the second substrate is transferred onto the first substrate before the second suspended part is made by etching, said second part being made on the front face or a back face of the first substrate, said first and second parts being released after transfer of the second substrate onto the first substrate.

15. The method according to claim 13, comprising a step to etch the first substrate at its back face to reach the treated zone.

16. The method according to claim 13, in which the first suspended part and the second suspended part are released simultaneously and made starting from the front face.

17. The method according to claim 16, in which the first suspended part and the second suspended part are released by removal of oxide.

18. The method according to claim 13, in which the second etching in step c) reaches the interface between the first and the second substrates.

19. The method according to claim 18, comprising, a step d1) to oxidize at least the treated zone between step d) and step e), and step e) is a step to remove the oxidized zone and in which the protective material is removed at the end of the step d1) and at least an open end of the trenches is closed off before the step for production of the second suspended part when the first and second suspended parts are formed on the front face.

20. The method according to claim 19, in which the open end of the trenches is close off by deposition of a TEOS oxide.

21. The method according to claim 13, in which the second suspended part is made by etching a back face of the first substrate.

22. The method according to claim 21, in which an oxide layer is formed on the front face of the first substrate before it is assembled with the second substrate, forming a stop layer for etching the second suspended part.

23. The method according to claim 22, in which the first suspended part is released by removal of the treated zone and the second suspended part is released by removal of said oxide layer, said releases being done simultaneously.

* * * * *